(12) United States Patent
Kubota et al.

(10) Patent No.: US 10,170,283 B2
(45) Date of Patent: Jan. 1, 2019

(54) FOCUS RING FOR PLASMA PROCESSING APPARATUS

(71) Applicant: COORSTEK KK, Tokyo (JP)

(72) Inventors: Masahiro Kubota, Tokyo (JP); Takaaki Shima, Tokyo (JP)

(73) Assignee: COORSTEK KK, Tokyo (JP)

( * ) Notice: Subject to any disclaimer, the term of this patent is extended or adjusted under 35 U.S.C. 154(b) by 507 days.

(21) Appl. No.: 14/630,859

(22) Filed: Feb. 25, 2015

(65) Prior Publication Data

US 2015/0243488 A1  Aug. 27, 2015

(30) Foreign Application Priority Data

Feb. 25, 2014  (JP) ................................ 2014-033529

(51) Int. Cl.
*H01J 37/32*  (2006.01)

(52) U.S. Cl.
CPC ............................. *H01J 37/32642* (2013.01)

(58) Field of Classification Search
USPC ................................................. 403/DIG. 15
See application file for complete search history.

(56) References Cited

U.S. PATENT DOCUMENTS

| | | | | |
|---|---|---|---|---|
| 6,074,488 A | * | 6/2000 | Roderick | H01L 21/6833 118/723 E |
| 2005/0144881 A1 | * | 7/2005 | Tate | E04F 15/10 52/578 |
| 2007/0000614 A1 | * | 1/2007 | Hatamura | H01L 21/67069 156/345.51 |
| 2009/0294064 A1 | * | 12/2009 | Nagayama | H01J 37/32623 156/345.39 |
| 2013/0168020 A1 | * | 7/2013 | Hashiguchi | H01J 37/32642 156/345.51 |
| 2015/0107773 A1 | * | 4/2015 | Shintaku | H01J 37/32275 156/345.41 |

FOREIGN PATENT DOCUMENTS

| | | |
|---|---|---|
| JP | 2011-003730 A | 1/2011 |
| JP | 2011003730 A * | 1/2011 |

OTHER PUBLICATIONS

English Machine Translation of JP2011003730 A.*

* cited by examiner

*Primary Examiner* — Rakesh K Dhingra
*Assistant Examiner* — Laureen Chan
(74) *Attorney, Agent, or Firm* — McCoy Russell LLP

(57) ABSTRACT

There is provided a focus ring formed without an adhesive that can suppress abnormal electric discharge and obtain uniform plasma environment in a circumferential direction in a plasma processing apparatus. The focus ring includes a plurality of arc-shaped members and a plurality of connecting members connecting the plurality of the arc-shaped members to form a ring shape without an adhesive, and is formed such that a thickness between an upper surface of the connecting member and a bottom surface of a concave fitting portion of the connecting member is greater than a thickness between an upper surface of the arc-shaped member and a bottom surface of a second depression of the arc-shaped member.

5 Claims, 10 Drawing Sheets

FOCUS RING FOR PLASMA PROCESSING APPARATUS

BACKGROUND OF THE INVENTION

Field of the Invention

The present invention relates to a focus ring, and in particular to a focus ring for placing a substrate to be processed thereon at an inner periphery portion of the focus ring, and that is disposed at an outer side of the substrate to be processed in a plasma processing apparatus.

Description of the Related Art

In a semiconductor device manufacturing process, a plasma processing apparatus such as a plasma etching apparatus and a plasma CVD apparatus is used for processing such as etching a substrate to be processed.

At that time, a focus ring is disposed to surround the substrate to be processed for performing the plasma processing uniformly on the substrate.

The focus ring is disposed at an outer side of the substrate to be processed, and for example, the substrate to be processed is placed at an inner periphery portion of the focus ring so as to form so-called a pseud substrate (pseud wafer) around the substrate and perform the plasma processing uniformly on the substrate (wafer).

The focus ring is made of silicon, and formed into a ring shape having a larger outer diameter than a diameter of the substrate to be processed.

Generally, a ring-shaped focus ring is obtained by slicing a single crystalline silicon ingot, cutting out a disk-shaped member therefrom, and hollowing out the center part of the disk-shaped member.

Note that in recent years, a diameter of the substrate to be processed has generally been made larger, hence a focus ring of a large diameter is required.

However, in order to manufacture the focus ring, the single crystalline silicon ingot having an outer diameter greater than the diameter (outer diameter) of the substrate to be processed must be prepared. It is difficult to manufacture the ingot having the greater outer diameter than the outer diameter of the substrate to be processed that has a maximum diameter.

In addition, since the focus ring is manufactured by cutting the disk-shaped member out of the ingot and hollowing out the disk-shaped member to form a ring shape, there is a problem of material waste that causes increase in manufacturing costs.

As a solution for these problems, a silicon ring for a plasma processing apparatus has been proposed in Japanese Patent Application Publication No. 2011-3730. The silicon ring can be obtained by dividing a focus ring into a plurality of pieces and connecting arc-shaped members (the divided pieces) in a circumferential direction to assemble them into a ring shape.

The silicon ring for the plasma processing apparatus disclosed in Japanese Patent Application Publication No. 2011-3730 will be described with reference to FIGS. 9 to 12.

As shown in FIGS. 9 and 10, the silicon ring 50 includes a first member 60 having an upwardly projecting portion 61 and a second member 70 having a downwardly projecting portion 71 as shown in FIGS. 9 and 11.

The silicon ring 50 shown in FIG. 9 is formed by connecting the first member 60 and the second member 70.

In the first member 60 shown in FIG. 10, the upwardly projecting portion 61 is integrally formed at a lengthwise center portion of a flat plat plate portion 62 having a strip arc shape, and upwardly opening depressions 63 are thereby formed on either side of the upwardly projecting portion 61.

On the other hand, in the second member 70 shown in FIG. 11, contrary to the first member 60, the downwardly projecting portion 71 is integrally formed at a lengthwise center portion of a flat plate portion 72 having a stripe arc shape, and downwardly opening depressions 73 are thereby formed on either side of the downwardly projecting portion 71.

The first members 60 and second members 70 are arranged alternately in the circumferential direction so that the depressions 63 formed on either side of the projecting portion 61 of the first member 60 engage with the end portions (projecting portion) of the flat plate portion 72 formed on either side of the projecting portion 71 of the second member 70. The flat plate portion 62 of the first member 60 is overlapped with the flat plate portion 72 of the second member 70 so as to connect the first member 60 with the second member 70.

As shown in FIG. 12, the first member 60 and the second member 70 are bonded by a conductive adhesive 80 such as conductive resin adhesive.

The adhesive 80 is interposed in a particular area of an overlapping face F2 of an upper surface of the flat plate portion 62 of the first member 60 and a lower surface of the flat plate portion 72 of the second member 70, the overlapping face F2 being parallel to a plasma-facing surface F1. The adhesive is not exposed to an abutting surface F3 between the first member 60 and the second member 70.

It is to be noted that although the adhesive of the silicon ring 50 is not exposed to the abutting surface F3 between the first member 60 and the second member 70, no small amount of etching gas enters therein.

Further, as shown in FIG. 12, the adhesive 80 is exposed to the exterior at a side surface of the outer circumferential side of the silicon ring 50.

Further, as shown in FIG. 12, the abutting surface F3 is being in intimate contact without a gap, hence a slight gap S1 exists between an end surface of the flat plate portion 62 of the first member 60 and an end surface of the projecting portion 71 of the second member 70. The adhesive 80 is exposed to the exterior through the gap S1.

As such, the adhesive of this silicon ring is exposed at the position other than the abutting surface F3 between the first member 60 and the second member 70 that is exposed to the plasma-facing surface. If such a silicon ring is used as a focus ring in the plasma processing apparatus, gas emission occurs due to degradation of the adhesive, hence there arises a problem of occurrence of abnormal electric discharge (arcing).

Further, as shown in FIGS. 9 and 12, the projecting portion 71 of the second member 70 constitutes part of lower surface of the silicon ring 50.

If processing of the projection portion 71 is inaccurate, concave part can be formed on the lower surface of the silicon ring 50, hence the silicon ring may include a part that does not contact a pedestal (support table).

Temperature of the pedestal (support table) is controlled to maintain a processing surface of the substrate to be processed (wafer) at a constant temperature.

Thus, if the projecting portion 71 is processed inaccurately and does not contact the pedestal (support table) as described the above, thermal conductivity in the circumferential direction of the silicon ring becomes uneven.

Thus, if using this silicon ring as a focus ring, there arises problems of poor thermal uniformity and non-uniformity in a plasma environment in the circumferential direction within the plasma processing apparatus. These problems cause difficulty in performing uniform plasma processing on the substrate.

SUMMARY OF THE INVENTION

The present invention has been made to solve the above-mentioned technical problems. The object of the present invention is to provide a focus ring that is for use in a plasma processing apparatus, formed without using an adhesive, and can suppress abnormal electric discharge and obtain uniform plasma environment in the circumferential direction.

In order to solve the above problem, a focus ring made of silicon in accordance with the present invention includes a plurality of arc-shaped members, each of the plurality of arc-shaped members including a flat plate portion having an arc shape, open-topped first depressions formed at both circumferential ends of the flat plate portion, a stepped portion formed with an open-topped second depression at an inner circumferential side of the flat plate portion, and convex fitting portions formed on bottom surfaces of the first depressions; and a plurality of connecting members connecting the plurality of arc-shaped members to form a ring shape without an adhesive, each of the plurality of connecting members including a plate-like main body having an arc shape to be accommodated within the depressions of the adjacent arc-shaped members, a stepped portion formed with an open-topped depression at an inner circumferential side of the plate-like main body, and concave fitting portions formed in a lower surface of the plate-like main body and configured to engage with the respective convex fitting portions of the adjacent arc-shaped members, wherein a thickness between an upper surface of the connecting member and a bottom surface of the concave fitting portion of the connecting member is greater than a thickness between an upper surface of the arc-shaped member and a bottom surface of the second depression of the arc-shaped member.

Since the focus ring is formed without using the adhesive, it is possible to suppress gas emission caused by degradation of the adhesive and suppress abnormal electric discharge (arcing).

Further, in order to form a ring shape, the arc-shaped members are disposed to be in contact with one another at opposing end portions of the arc-shaped members, hence whole lower surfaces of the arc-shaped members contact a pedestal (support table). Therefore, the focus ring is excellent in thermal uniformity and it is possible to perform uniform processing on a substrate.

Further, the focus ring in accordance with the present invention is configured such that the respective arc-shaped members are connected in the circumferential direction by engaging the convex fitting portions formed on the bottom surfaces of the first depressions of the arc-shaped member with the concave fitting portions formed in a lower surface of the connecting member.

Thus, even if etching gas is introduced into a gap between the arc-shaped member and the connecting member and that causes erosion of a lateral abutment surface of the arc-shaped member and the connecting member, the etching gas is not introduced continuously into the above-mentioned fitting portions. Thus, the upper surfaces of the arc-shaped members and the upper surfaces of the connecting members always remain coplanar within an allowed range.

As a result, it becomes possible to maintain uniform plasma environment in the circumferential direction within the plasma processing apparatus. Further, occurrence of abnormal electric discharge (arcing) due to exposure of an edge part of the flat plate portion of the arc-shaped member to the surface can possibly be prevented.

Further, because the thickness between the upper surface of the connecting member and a bottom surface of the concave fitting portion of the connecting member is greater than the thickness between the upper surface of the arc-shaped member and the bottom surface of the second depression of the arc-shaped member, even in the case where the upper surfaces of the arc-shaped member and the connecting member are consumed by etching or the like, the concave fitting portion is not exposed to the upper surface of the connecting member. That is, the concave fitting portion is not opened, and thus occurrence of the abnormal electric discharge (arcing) can be prevented.

In the above-mentioned focus ring, it is preferable that the concave fitting portions of the connecting member are not positioned above end surfaces of opposing end portions of the adjacent arc-shaped members.

Because the concave fitting portions (thin portions) of the connecting member are not positioned above the end surfaces of the opposing end portions of the arc-shaped members, a durability of the connecting member can be further improved.

Further, when the connecting member engages the arc-shaped members, a gap of is preferably formed between the convex fitting portion of the arc-shaped member and the concave fitting portion of the connecting member, the gap being equal to or greater than 50 μm and equal to or less than 100 μm.

This gap can more effectively prevent the etching gas from being introduced continuously into the fitting portions of the arc-shaped member and the connecting member. Thus, the upper surfaces of the arc-shaped members and the upper surfaces of the connecting members can remain coplanar within an allowed range.

As a result, uniform plasma environment in the circumferential direction within the plasma processing apparatus can be maintained.

Further, it is preferable that the arc-shaped members and the connecting members of the focus ring all have a specific resistance value of from 1 Ω·cm to 5 Ω·cm, respectively, and a variation of the specific resistance value is within +/−1% of an average specific resistance value of all the arc-shaped members and the connecting members.

By uniformalizing the specific resistance value of all the arc-shaped members and connecting members as described the above, it becomes possible to render a plasma electric discharge more uniform.

According to the present invention that has been made to solve the above-mentioned technical problems, there is provided a focus ring being formed without an adhesive that can enhance mechanical strength and improve thermal uniformity thereof. When the focus ring is used in the plasma processing apparatus, abnormal electric discharge can be suppressed, and uniform plasma environment in the circumferential direction can be obtained.

DESCRIPTION OF THE PREFERRED EMBODIMENTS

Hereinafter, an embodiment of a focus ring according to the present invention will be described with reference to FIGS. 1 to 3.

A focus ring 1, for example, has an inner diameter of 450 mm, an outer diameter of 550 mm, a thickness of 7 mm (particularly effective ranges are the inner diameter of from 290 mm to 450 mm, the outer diameter of from 350 mm to 550 mm and the thickness of from 2 mm to 10 mm.)

Figure 1:
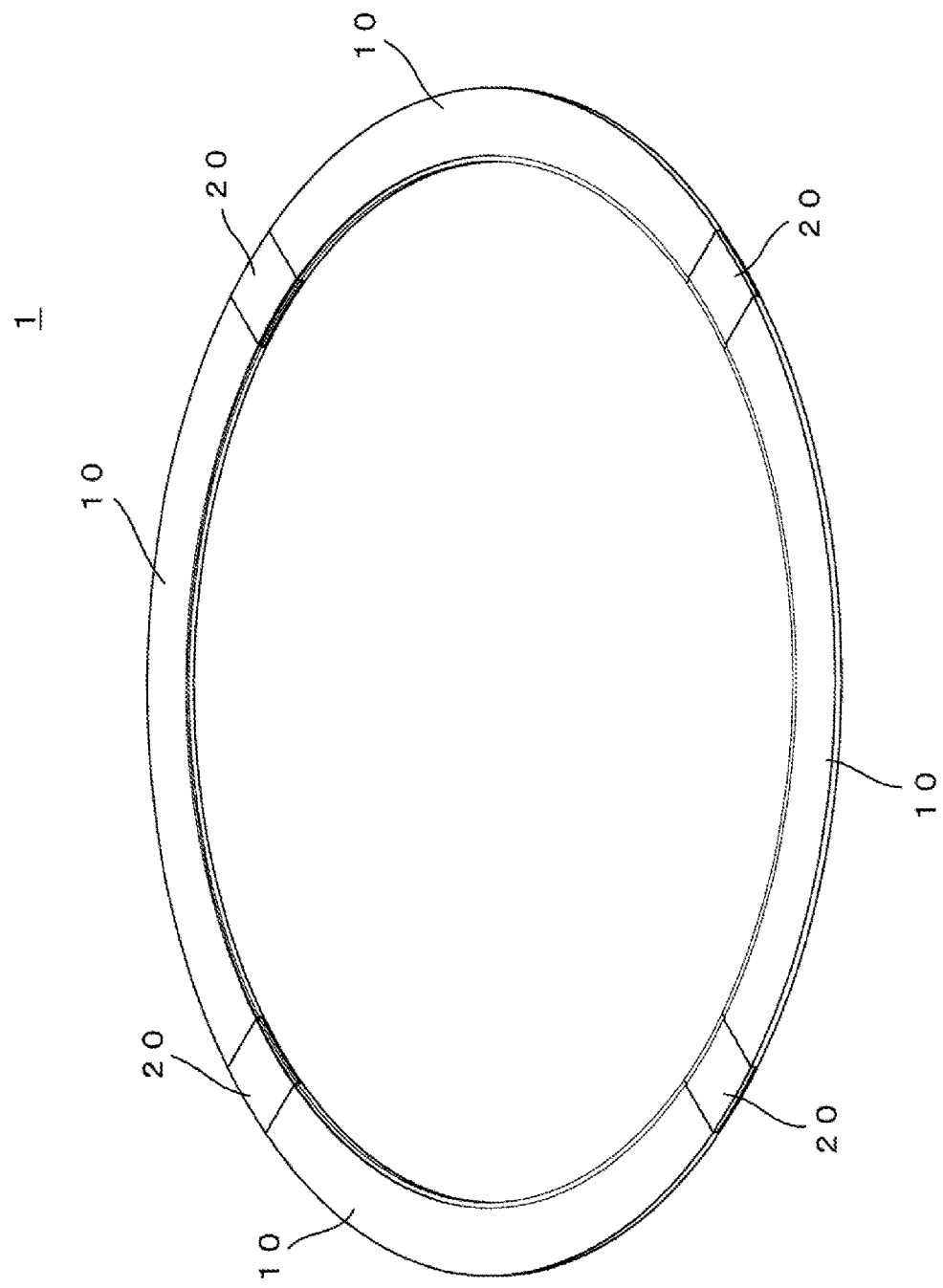
FIG. 1 is a perspective view of a focus ring according to an embodiment of the present invention.

As shown in FIG. 1, the focus ring 1 is configured by four arc-shaped members 10 and four connecting members 20 that connect the arc-shaped members. The focus ring 1 is formed into a ring shape by connecting the arc-shaped members 10 with the connecting members 20 without using an adhesive.

The reason for forming the focus ring 1 into a ring shape by connecting the arc-shaped members 10 with the connecting members 20 without using the adhesive is that it is possible to suppress gas emission caused by degradation of the adhesive and suppress abnormal electric discharge (arcing).

The arc-shaped member 10 and the connecting member 20 are made of single crystalline silicon or polycrystalline silicon.

Because the polycrystalline silicon may cause dusting (particle) during processing, the single crystalline silicon is more preferable.

Figure 2:
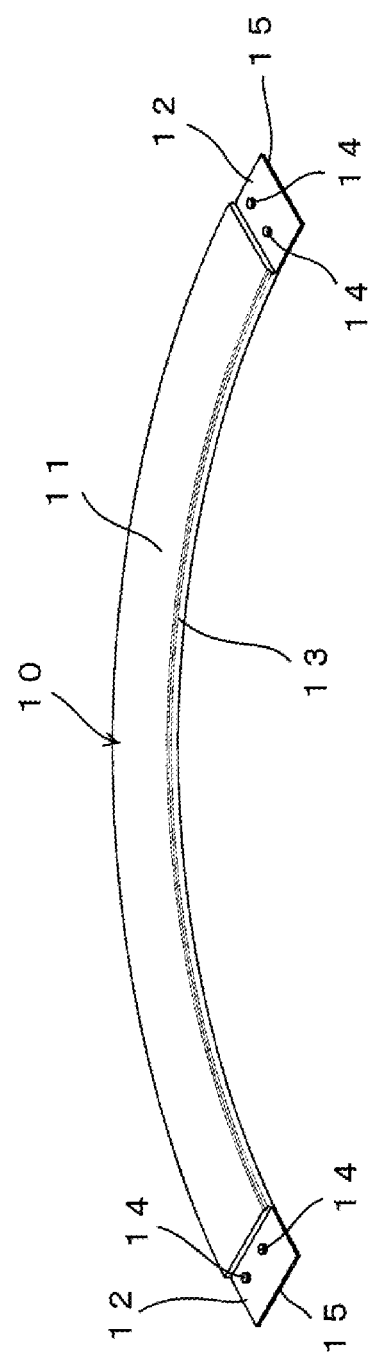
FIG. 2 is a perspective view of an arc-shaped member that constitutes part of the focus ring according to an embodiment of the present invention.

As shown in FIG. 2, the arc-shaped member 10 includes a flat plate portion 11 having an arc shape, and open-topped first depressions 12 formed at both circumferential ends of the flat plate portion 11.

Further, the arc-shaped member 10 includes a stepped portion 13 formed with an open-topped second depression formed at an inner circumferential side of the flat plate portion 11, and convex fitting portions 14 formed on bottom surfaces of the first depressions 12.

Note that the stepped portion 13 can be used as a substrate support portion that supports a substrate to be processed. As a preferred embodiment to obtain the above-described effect, FIG. 2 shows convex fitting portions 14 that are two cylindrical projections provided respectively on each of the first depressions 12, but the present invention is not limited thereto. Each convex fitting portion 14 may be one projection, or two projections or more. Additionally, a cross-sectional shape of the convex fitting portion 14 may be other than circle, such as square and ellipse.

Figure 3:
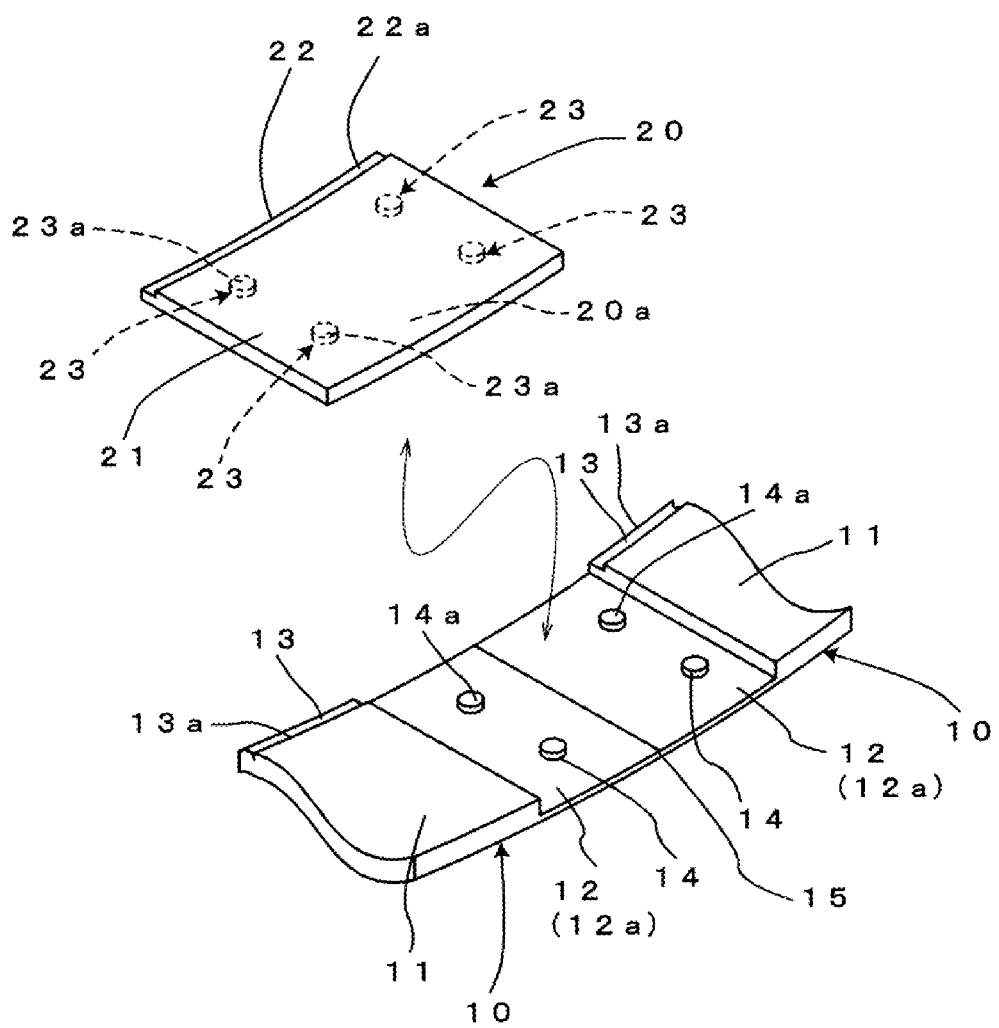
FIG. 3 is an exploded perspective view according to an embodiment of the present invention.

As shown in FIG. 3, when the arc-shaped members 10 are connected to form a ring shape, an end surface 15 of opposing end portions of the arc-shaped member 10 is positioned to be in contact with an end surface 15 of opposing end portions of adjacently positioned arc-shaped member.

As such, in order to form a ring shape, the arc-shaped members 10 are disposed to be in contact with one another at the opposing end portions of the arc-shaped members 10, hence lower surfaces of the arc-shaped members 10 contact a pedestal (support table).

The focus ring 1 does not have a structure like the above-mentioned conventional silicon ring 50 in which the first member 60 and the second member 70 contact the pedestal (support table) alternately.

Thus, because the whole lower surfaces of the arc-shaped members (the whole lower surface of the focus ring 1) contact the pedestal (support table), the focus ring 1 has better thermal conductivity in the circumferential direction of the arc-shaped member 10 than the conventional silicon ring 50. Thus, plasma processing can be performed more uniformly on the substrate.

Further, because the first member 60 and the second member 70 of the conventional silicon ring 50 are disposed alternately, thermal conduction in the circumferential direction is provided through the first member 60 and the second member 70 that are non-continuously disposed. Thus, it is difficult to achieve a uniform thermal conductivity in the circumferential direction.

By contrast, in the focus ring 1, the end surfaces 15 of the adjacent arc-shaped members 10 are in contact one another, and the lower surfaces of the arc-shaped members contact the pedestal (support table). Thus, it enables to achieve better uniformity in the thermal conductivity in the circumferential direction.

Additionally, as shown in FIG. 3, the connecting member 20 includes a plate-like main body 21 having an arc shape to be accommodated within the depressions 12, 12 of adjacent arc-shaped members 10, 10, and a stepped portion 22 formed with an open-topped depression formed at an inner circumferential side of the plate-like main body 21.

A bottom surface 22a of the depression that forms the stepped portion 22 of the connecting member 20 is positioned be the same height as a bottom surface 13a of the depression that forms the stepped portion 13 of the arc-shaped member 10. Thus, the stepped portion 13 and the stepped portion 22 can be used as support portions that support the entire circumference of the substrate to be processed.

Further, concave fitting portions 23, 23 are formed in the lower surface of the main body 21 and configured to engage with the respective convex fitting portions 14, 14 of the adjacent arc-shaped members 10, 10.

The concave fitting portion 23 is formed in the connecting member 20 side and the convex fitting portion 14 is formed in the arc-shaped member 10 side because of the following reason.

Figure 4:
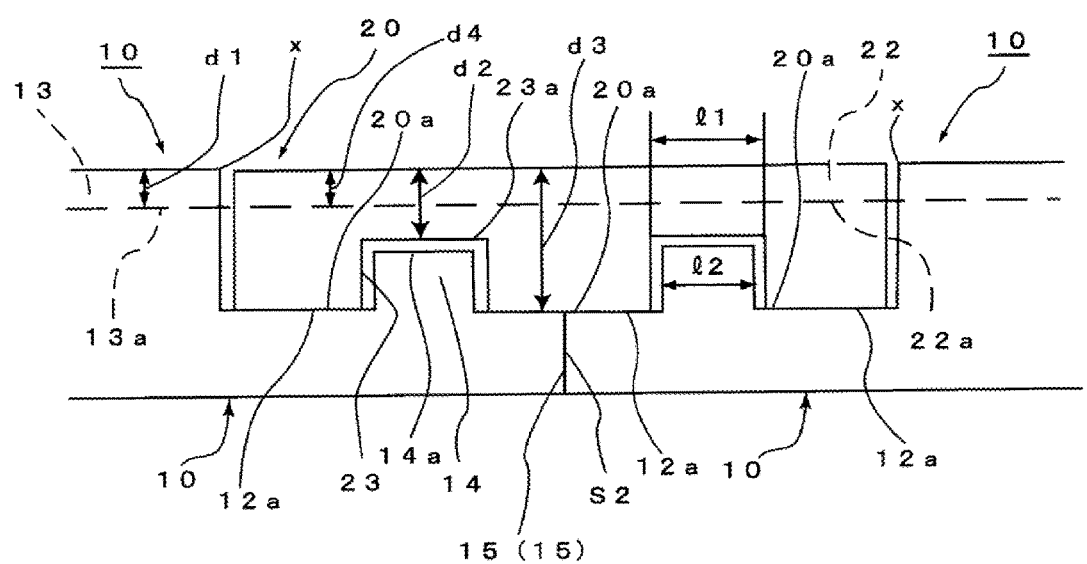
FIG. 4 is a partial cross-sectional view of a connecting member and the arc-shaped member according to an embodiment of the present invention, taken along the circumferential direction.

By this configuration, even if etching gas is introduced into a gap between the arc-shaped member 10 and the connecting member 20 as shown in FIG. 4 and causes erosion of a lateral abutment surface of the arc-shaped member 10 and the connecting member 20 (a bottom surface 12a of the first depression 12 of the arc-shaped member 10 and a lower surface 20a of the connecting member 20 that contacts the bottom surface 12a of the first depression 12), the etching gas is not introduced continuously into the fitting portions (an upper surface 14a of the convex fitting portion 14 and a bottom surface 23a of the concave fitting portion 23). Thus, erosion of the upper surface 14a of the convex fitting portion 14 and the bottom surface 23a of the concave fitting portion 23 is prevented.

In other words, once the etching gas is introduced into the inside the fitting portions, the etching gas stagnates therein so new etching gas will not be introduced. Thus, progress of etching within the fitting portion (the upper surface 14a of the convex fitting portion 14 and the bottom surface 23a of the concave fitting portion 23) can be almost avoided.

Consequently, the upper surfaces of the arc-shaped members 10 and the upper surfaces of the connecting members 20 always remain coplanar within an allowed range. Further, since the upper surfaces of the arc-shaped members 10 and the upper surfaces of the connecting members 20 always remain coplanar within an allowed range, uniform plasma environment in the circumferential direction within the plasma processing apparatus can be maintained. Further, occurrence of abnormal electric discharge (arcing) due to exposure of an edge part X of the flat plate portion 11 of the arc-shaped member 10 to the surface can be prevented.

Note that as a preferred embodiment to obtain the above-described effect, FIG. 3 shows the concave fitting portions 23 that are four recesses having a circular cross-sectional shape, but the present invention is not limited thereto. The number of the recesses are corresponding to the number of the convex fitting portions 14, 14 of the adjacent arc-shaped members 10, 10.

Further, the cross-sectional shape of the concave fitting portion 23 may be other than circle, such as square and ellipse.

Further, as shown in FIG. 4, a thickness d2 between the upper surface of the connecting member 20 and the bottom surface of the concave fitting portion 23 is greater than a thickness d1 between the upper surface of the arc-shaped member 10 and the bottom surface 13a of the second depression of the arc-shaped member 10.

The focus ring is gradually consumed by use. If the focus ring is consumed, the concave fitting portion 23 is exposed to the upper surface of the connecting member 20, and the concave fitting portion 23 is opened. This causes occurrence of the abnormal electric discharge (arcing).

In order to prevent the abnormal electric discharge, the thickness d2 is preferably greater than the thickness d1. If the connecting member 20 is consumed, the thickness of the connecting member 20 becomes thinner, and the connecting member 20 may easily fall out of the arc-shaped member 10. In order to prevent this problem, the thickness d2 is preferably greater than the thickness d1.

As described the above and shown in FIG. 4, the bottom surface 22a of the depression that forms the stepped portion 22 of the connecting member 20 is positioned to be the same height as the bottom surface 13a of the depression that forms the stepped portion 13 of the arc-shaped member 10. Namely, the thickness d1 between the upper surface of the arc-shaped member and the bottom surface 13a of the second depression of the arc-shaped member 10 and a thickness d4 between the upper surface of the connecting member 20 and the bottom surface of the stepped portion formed with the depression of the connecting member 20 are of the same thickness. That is, the thickness d2 between the upper surface of the connecting member 20 and the bottom surface of the concave fitting portion 23 is preferably greater than the thickness d4 between the upper surface of the connecting member 20 and the bottom surface of the stepped portion formed with the depression of the connecting member 20.

Preferably, the concave fitting portions 23 of the connecting member 20 are not positioned above the end surfaces 15 of the opposing end portions of the adjacent arc-shaped members (flat plate portions 11), as shown in FIG. 4.

Not a little gap S2 is formed between adjacent portions between the end surfaces 15 of the circumferential opposing end portions of the adjacent arc-shaped members 10. The etching gas is introduced through the gap S2 and etches the lower surface of the connecting member 20, whereas the etching gas also etches the upper surface of the connecting member 20.

Thus, because the concave fitting portion 23 has a small thickness dimension, it is not preferable that the concave fitting portion 23 is positioned above the gap S2 (adjacent portions between the end surfaces 15 of the opposing end portions of the adjacent arc-shaped members 10).

Further, difference between the diameter $l_2$ of the convex fitting portion 14 of the arc-shaped member 10 and the diameter $l_1$ of the concave fitting portion 23 of the connecting member 20 is preferably equal to or greater than 50 μm and equal to or less than 100 μm. That is, the gap formed between the convex fitting portion 14 and the concave fitting portion 23 is preferably equal to or greater than 50 μm and equal to or less than 100 μm.

With this gap, it is possible to prevent the etching gas from being introduced continuously into the fitting portions of the arc-shaped member and the connecting member. Thus, the upper surfaces of the arc-shaped members and the upper surfaces of the connecting members can remain coplanar within an allowed range.

As a result, uniform plasma environment in the circumferential direction within the plasma processing apparatus can be maintained.

Preferably, the arc-shaped members 10 and the connecting members 20 all have a specific resistance value of from 1 Ω·cm to 5 Ω·cm, respectively, and a variation of the specific resistance value is within +/−1% of an average specific resistance value of all the arc-shaped members 10 and the connecting members 20.

By uniformalizing the specific resistance values of all the arc-shaped members and 10 connecting members 20 as described the above, it becomes possible to render a plasma electric discharge more uniform.

Since a neck portion of the single crystalline silicon ingot and a tail portion thereof have different specific resistance values, all the arc-shaped members 10 and all the connecting members 20 are preferably formed from a same disk-shaped member that is cut out from the same ingot.

Next, manufacturing method of the focus ring according to the present invention will be described.

Firstly, a row material of polysilicon is charged in a quartz crucible, boron is doped thereto, and a boron-doped p-type single crystalline silicon ingot having a diameter of 430 mm and a specific resistance value of 1.7 Ω·cm is manufactured by the CZ method.

Then, after cutting a neck portion and a crown portion of the ingot, a disk-shaped member with a thickness of 4 mm is sliced from a body of the ingot by a band-saw.

And then, the arc-shaped members and the connecting members are cut out from the disk-shaped member by using a machining center.

At that time, all the arc-shaped members and the connecting members are preferably cut out from the same disk-shaped member.

Thus obtained arc-shaped members and connecting members are respectively processed into the shapes as shown in FIGS. 1 to 3, then subjected to degreasing and cleaning. And then, so-called chemical polishing, which is etching with an $HF+HNO_3+CH_3COOH$ solution for removing a damaged layer damaged due to a mechanical processing, is performed on the surfaces of the arc-shaped members and connecting members.

The chemical polishing is followed by assembling and inspecting. If the inspection result is acceptable, an HF cleaning is performed to obtain finished products of the arc-shaped members and the connecting members.

The arc-shaped members and the connecting members are assembled into a focus ring when using these members as a focus ring (dimensions of the assembled focus ring were an inner diameter of 455 mm, an outer diameter of 520 mm and a thickness of 4 mm). Further, all the gaps $l_1-l_2$ ($l_1$ minus $l_2$) shown in FIG. 4 formed between the arc-shaped member and the connecting member were within a range of from 65 to 78 μm, and specific resistance values of the respective members were within a range of 1.7 Ω·cm+/−1%.

Note that in the above-described embodiment, an example in which the focus ring 1 is configured by four arc-shaped members 10 and four connecting members 20 that connect the arc-shaped members 10. However, the present invention is not limited thereto, the focus ring 1 is preferably configured by three or more arc-shaped members and connecting members, respectively.

Further, since the arc-shaped member and the connecting member are consumable parts, they may be sold alone respectively as a replacement part. At that time, it is preferable to select the replacement part having a specific resistance value of from 1 Ω·cm to 5 Ω·cm, and within +/−1% of an average specific resistance value of all other members.

Embodiment

Figure 5:
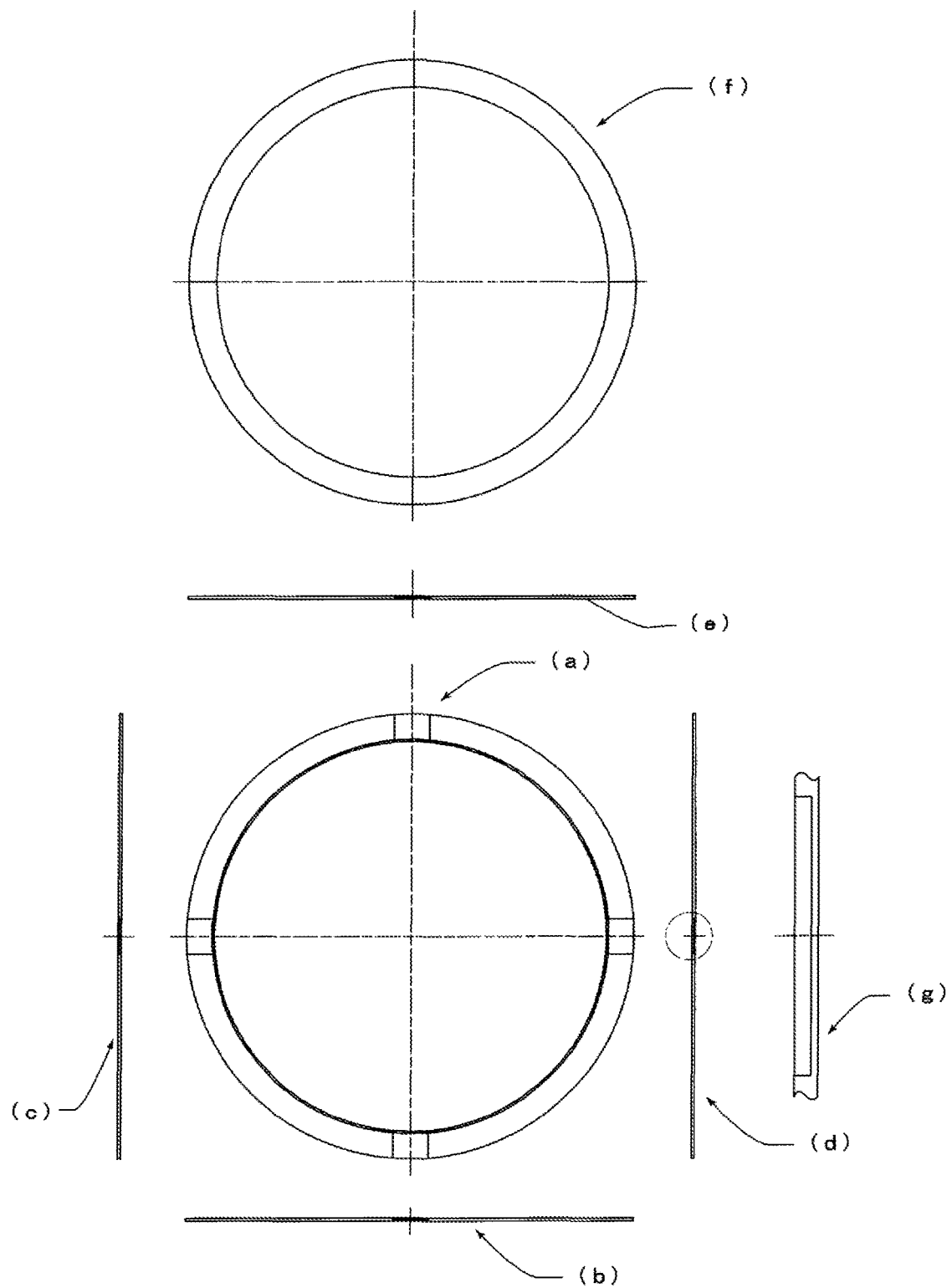
FIG. 5 shows a specific shape of the focus ring according to the present invention.
Figure 6:
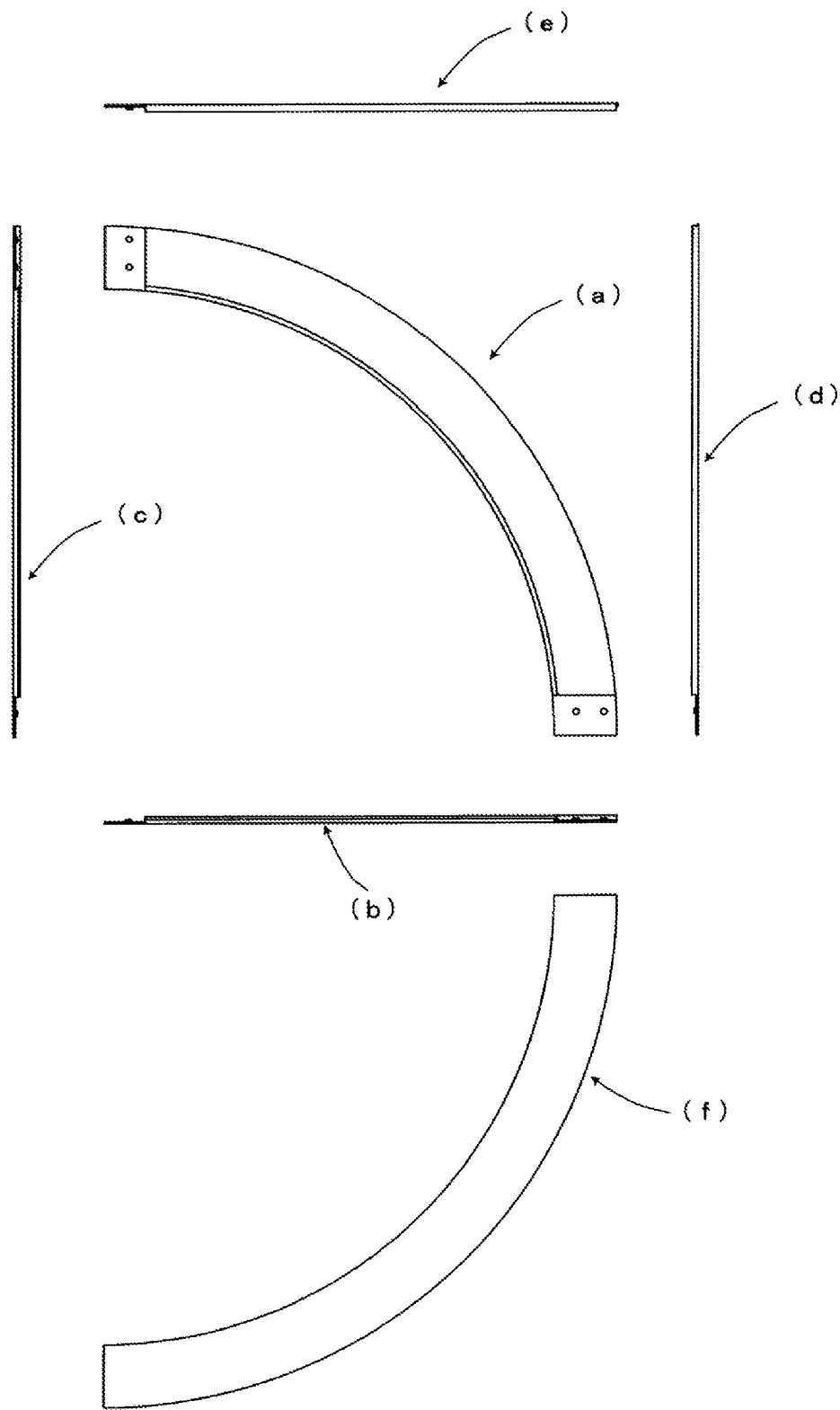
FIG. 6 shows a specific shape of the arc-shaped member of the present invention.
Figure 7:
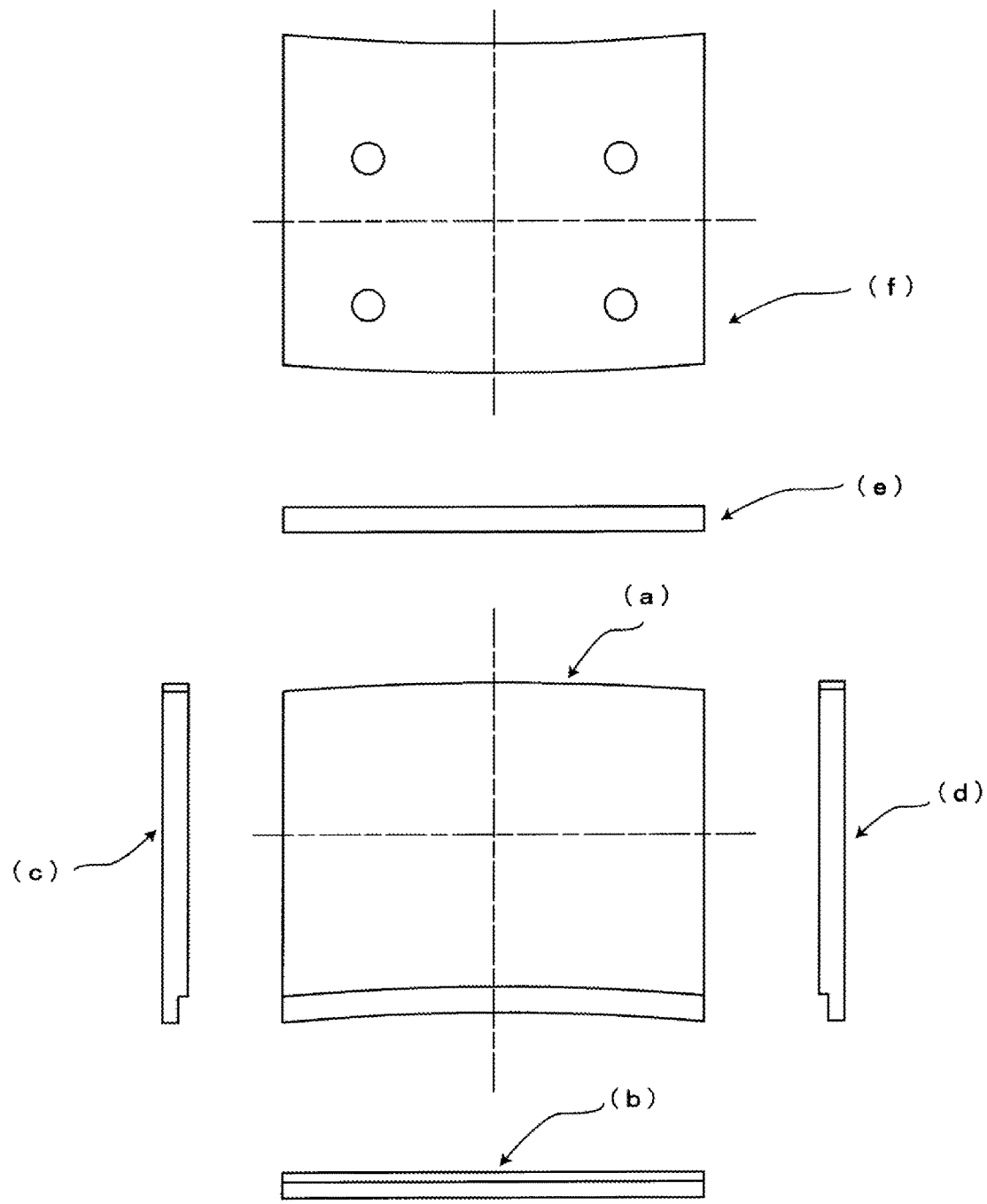
FIG. 7 shows a specific shape of the connecting member of the present invention.

FIGS. 5 to 7 show specific shapes of the focus ring, and the arc-shaped member and the connecting member that form the focus ring.

In FIG. 5, (a) shows a plan view of the focus ring, (b) shows a front view of the focus ring, (c) shows a left-side view of the focus ring, (d) shows a right-side view of the focus ring, (e) shows a rear view of the focus ring, (f) shows a bottom view of the focus ring, and (g) shows an enlarged view of a portion indicated by the dash-dot line in FIG. 5 (d).

In FIG. 6, (a) shows a plan view of the arc-shaped member, (b) shows a front view of the arc-shaped member, (c) shows a left-side view of the arc-shaped member, (d) shows a right-side view of the arc-shaped member, (e) shows a rear view of the arc-shaped member and (f) shows a bottom view of the arc-shaped member.

Figure 8:
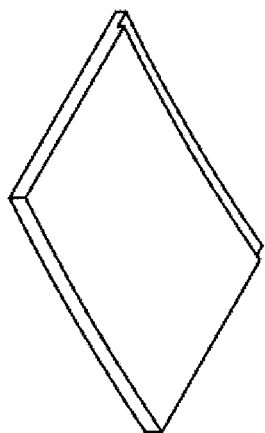
FIG. 8 is a perspective view of the connecting member of the present invention.
Figure 9:
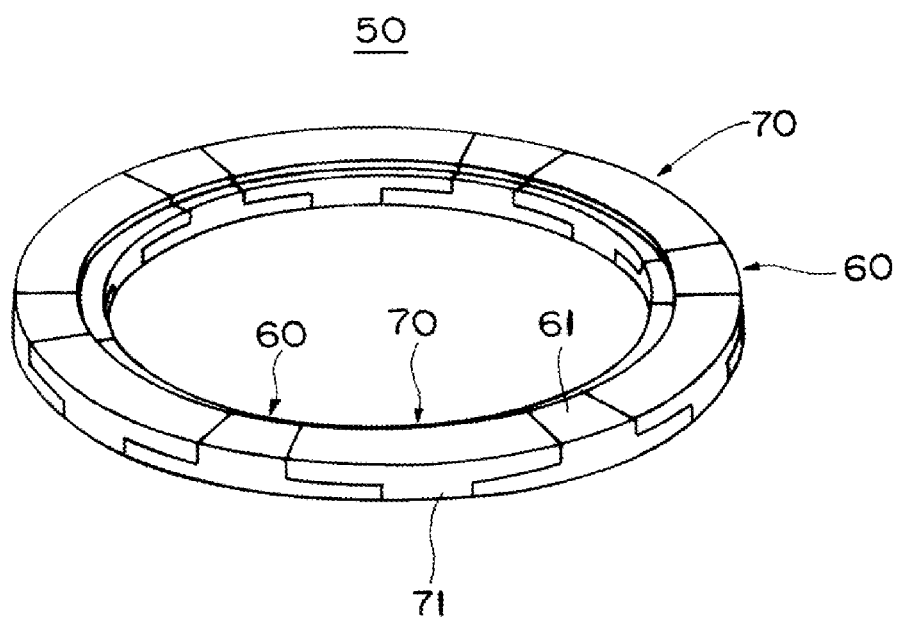
FIG. 9 is a perspective view of a silicon ring according to the related art.
Figure 10:
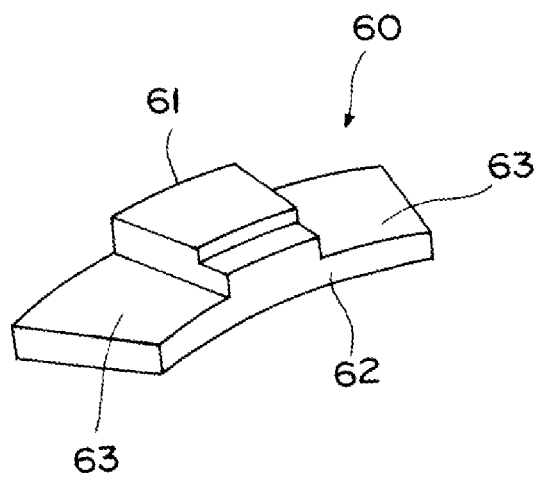
FIG. 10 is a perspective view of a first member of the silicon ring according to the related art.
Figure 11:
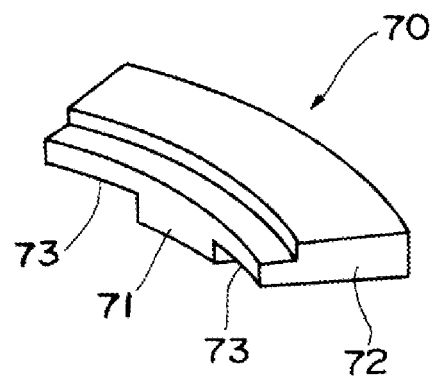
FIG. 11 is a perspective view of a second member of the silicon ring according to the related art.
Figure 12:
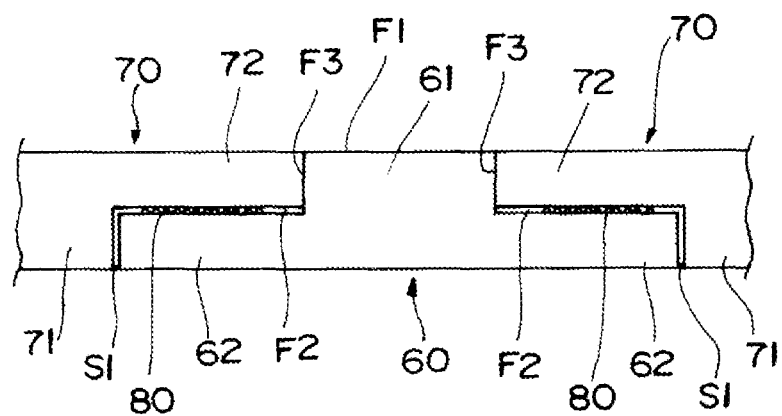
FIG. 12 is a side view showing a part of a circumferential side surface of the silicon ring shown in FIG. 9.

In FIG. 7, (a) shows a plan view of the connecting member, (b) shows a front view of the connecting member, (c) shows a left-side view of the connecting member, (d) shows a right-side view of the connecting member, (e) shows a rear view of the connecting member and (f) shows a bottom view of the connecting member. FIG. 8 shows a perspective view of the connecting member.

What is claimed is:

1. A focus ring made of silicon comprising:
a plurality of arc-shaped members, each of the plurality of arc-shaped members including a flat plate portion having an arc shape, open-topped first depressions formed at both circumferential ends of the flat plate portion, a stepped portion formed with an open-topped second depression at an inner circumferential side of the flat plate portion, and convex fitting portions formed on bottom surfaces of the first depressions;
a plurality of connecting members connecting the plurality of arc-shaped members to form a ring shape without an adhesive, each of the plurality of connecting members including a plate-like main body having an arc shape to be accommodated within the first depressions of the adjacent arc-shaped members, a stepped portion formed with an open-topped depression at an inner circumferential side of the plate-like main body, and concave fitting portions formed in a lower surface of the plate-like main body and configured to engage with the respective convex fitting portions of the adjacent arc-shaped members,
wherein a thickness between an upper surface of the connecting member and a bottom surface of the concave fitting portion of the connecting member is greater than a thickness between an upper surface of the arc-shaped member and a bottom surface of the second depression of the arc-shaped member; and
wherein the plurality of arc-shaped members is disposed to be in contact with one another at opposing end portions of the arc-shaped members, thereby forming a ring shape, and the connecting members are accommodated in the first depressions of the adjacent arc-shaped members, and wherein the plurality of arc-shaped members is connected with the connecting members whereby the concave fitting portions of the connecting members are engaged with the convex fitting portions of the arc-shaped members,
wherein the concave fitting portions of the connecting members are not positioned above end surfaces of the opposing end portions of the adjacent arc-shaped members, and
wherein when the connecting member engages the arc-shaped members, a gap is formed between the convex fitting portion of the arc-shaped member and the concave fitting portion of the connecting member, the gap being equal to or greater than 50 μm and equal to or less than 100 μm.

2. A focus ring made of silicon comprising:
a plurality of arc-shaped members, each of the plurality of arc-shaped members including a flat plate portion having an arc shape, open-topped first depressions formed at both circumferential ends of the flat plate portion, a stepped portion formed with an open-topped second depression at an inner circumferential side of the flat plate portion, and convex fitting portions formed on bottom surfaces of the first depressions; and
a plurality of connecting members connecting the plurality of arc-shaped members to form a ring shape without an adhesive, each of the plurality of connecting members including a plate-like main body having an arc shape to be accommodated within the first depressions of the adjacent arc-shaped members, a stepped portion formed with an open-topped depression at an inner circumferential side of the plate-like main body, and concave fitting portions formed in a lower surface of the plate-like main body and configured to engage with the respective convex fitting portions of the adjacent arc-shaped members, wherein a thickness between an upper surface of the connecting member and a bottom surface of the concave fitting portion of the connecting member is greater than a thickness between the upper surface of the connecting member and a bottom surface of the stepped portion formed with the depression of the connecting member, and wherein the plurality of arc-shaped members is disposed to be in contact with one another at opposing end portions of the arc-shaped members, thereby forming a ring shape, and the connecting members are accommodated in the first depressions of the adjacent arc-shaped members, and wherein the plurality of arc-shaped members is connected with the connecting members whereby the concave fitting portions of the connecting members are engaged with the convex fitting portions of the arc-shaped member, wherein the concave fitting portions of the connecting members are not positioned above end surfaces of the opposing end portions of the adjacent arc-shaped members, wherein when the connecting member engages the arc-shaped members, a gap is formed between the convex fitting portion of the arc-shaped member and the concave fitting portion of the connecting member, the gap being equal to or greater than 50 μm and equal to or less than 100 μm.

3. The focus ring as claimed in claim 1, wherein a bottom surface of the depression that forms the stepped portion of the connecting member is positioned to be the same height as the bottom surface of the second depression that forms the stepped portion of the arc-shaped member.

4. The focus ring as claimed in claim 1, wherein the arc-shaped members and the connecting members all have a specific resistance value of from 1 Ω·cm to 5 Ω·cm, respectively, and a variation of the specific resistance value is within +/−1% of an average specific resistance value of all the arc-shaped members and the connecting members.

5. The focus ring as claimed in claim 2, wherein the arc-shaped members and the connecting members all have a specific resistance value of from 1 Ω·cm to 5 Ω·cm, respectively, and a variation of the specific resistance value is within +/−1% of an average specific resistance value of all the arc-shaped members and the connecting members.

* * * * *